(12) United States Patent
Dogome et al.

(10) Patent No.: US 12,198,952 B2
(45) Date of Patent: Jan. 14, 2025

(54) SUBSTRATE PROCESSING APPARATUS

(71) Applicant: TOKYO ELECTRON LIMITED, Tokyo (JP)

(72) Inventors: Masahiro Dogome, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 413 days.

(21) Appl. No.: 17/577,152

(22) Filed: Jan. 17, 2022

(65) Prior Publication Data
US 2022/0230898 A1    Jul. 21, 2022

(30) Foreign Application Priority Data

Jan. 15, 2021 (JP) .................. 2021-004768
Oct. 4, 2021 (JP) .................. 2021-163580

(51) Int. Cl.
*H01L 21/67* (2006.01)
*H01J 37/32* (2006.01)
*H01L 21/677* (2006.01)

(52) U.S. Cl.
CPC .. *H01L 21/67196* (2013.01); *H01J 37/32642* (2013.01); *H01L 21/67742* (2013.01); *H01J 2237/186* (2013.01)

(58) Field of Classification Search
CPC ......... H01L 21/67196; H01L 21/67742; H01L 21/67126; H01L 21/67201; H01L 21/67748; H01L 21/67184; H01L 21/67739; H01L 21/67167; H01L 21/67207; H01L 21/67769; H01L 21/68707; H01J 37/32642; H01J 2237/186

See application file for complete search history.

(56) References Cited

U.S. PATENT DOCUMENTS 4,822,450 A * 4/1989 Davis ............... C23C 16/54
                                              156/345.35
6,382,895 B1 * 5/2002 Konishi ............ H01L 21/6719
                                              414/217
9,502,275 B1 * 11/2016 Trussell ........... H01L 21/67178
(Continued)

FOREIGN PATENT DOCUMENTS

JP        2018198305 A * 12/2018 ....... H01L 21/67167

*Primary Examiner* — Saul Rodriguez
*Assistant Examiner* — Lucia Elba Rodriguez
(74) *Attorney, Agent, or Firm* — XSENSUS LLP

(57) ABSTRACT

Embodiments of this application discloses a substrate processing apparatus comprising: a vacuum transfer module having a vacuum transfer space and an opening; a wall unit attached to the opening and including a first gate valve and a second gate valve; a substrate processing module attached to the wall unit and having a substrate processing space communicating with the vacuum transfer space via the first gate valve; and a ring stocker attached to the wall unit and having a storage space for storing at least one annular member used in a plasma processing module. Moreover, the apparatus further includes a transfer mechanism disposed in the vacuum transfer space and transfers a substrate between the vacuum transfer space and the substrate processing space through the first gate valve and also transfers at least one annular member between the vacuum transfer space and the storage space via the second gate valve.

6 Claims, 8 Drawing Sheets

(56) References Cited

U.S. PATENT DOCUMENTS

| | | | |
|---|---|---|---|
| 2014/0154887 A1* | 6/2014 | Trivedi | H01L 21/3088 |
| | | | 156/345.31 |
| 2014/0161983 A1* | 6/2014 | Inagaki | H01L 21/67184 |
| | | | 134/32 |
| 2020/0008307 A1 | 3/2020 | Gould et al. | |

* cited by examiner

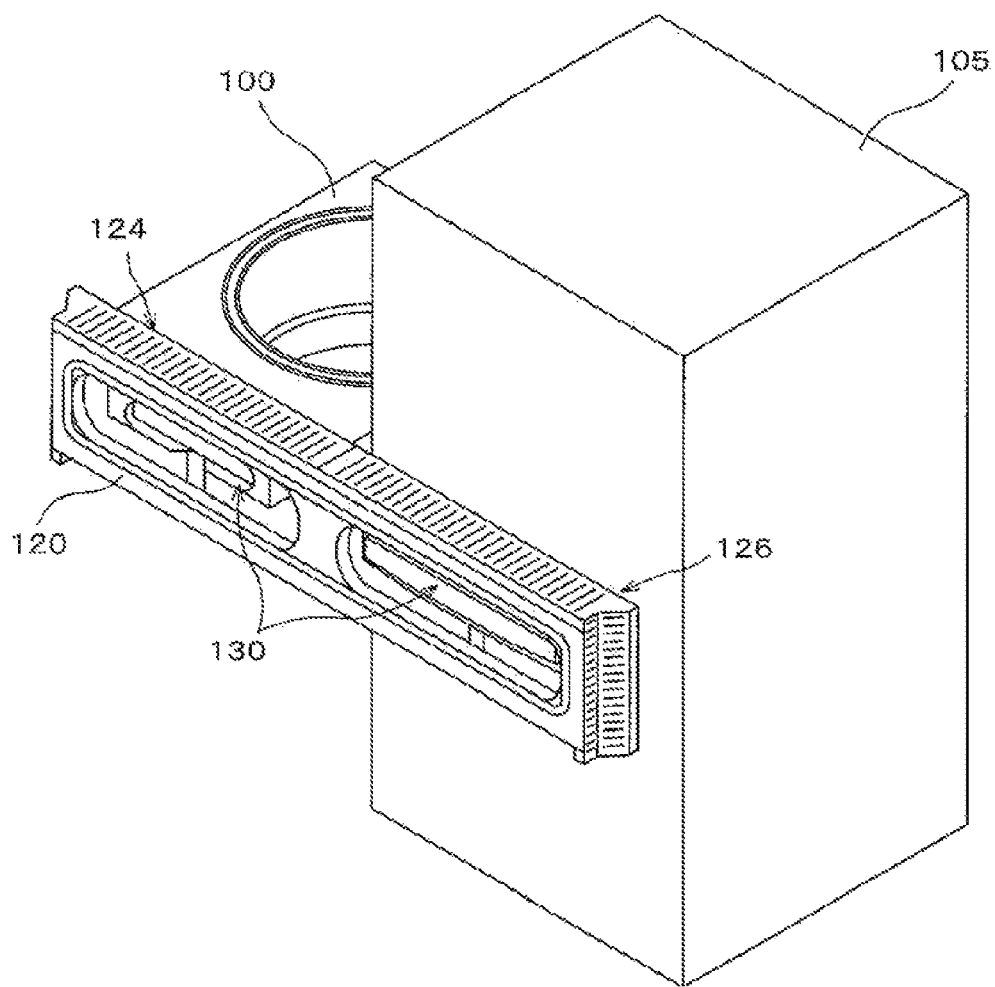

SUBSTRATE PROCESSING APPARATUS

CROSS-REFERENCE TO RELATED APPLICATIONS

This application claims priority to Japanese Patent Application Nos. 2021-004768 filed on Jan. 15, 2021 and 2021-163580 filed on Oct. 4, 2021, respectively, the entire contents of which are incorporated herein by reference and priority is claimed to each.

TECHNICAL FIELD

The present disclosure relates to a substrate processing apparatus.

BACKGROUND

U.S. Patent Publication No. 2020/0083071 A1 discloses a substrate processing apparatus for processing a substrate. The substrate processing apparatus includes an atmosphere part for processing a substrate in an atmospheric pressure and a depressurization part for processing a substrate in a depressurized atmosphere. The atmosphere part and the depressurization part are integrally connected via two load-lock modules whose inner atmospheres can be switched between an atmospheric pressure and a depressurized atmosphere.

SUMMARY

The technique of the present disclosure provides a substrate processing apparatus capable of attaching various modules such as a ring stocker and multiple types of processing modules having different internal dimensions, transfer distances, and the like without changing a design of a vacuum transfer module, and accurately transferring a transfer target object in the vacuum transfer module of the substrate processing apparatus.

In accordance with an aspect of the present disclosure, there is provided a substrate processing apparatus comprising: a vacuum transfer module having a vacuum transfer space and an opening; a wall unit attached to the opening and including a first gate valve and a second gate valve, a width of the second gate valve being greater than a width of the first gate valve; a substrate processing module attached to the wall unit and having a substrate processing space communicating with the vacuum transfer space via the first gate valve; a ring stocker attached to the wall unit and having a storage space for storing at least one annular member used in a plasma processing module, the storage space communicating with the vacuum transfer space via the second gate valve; and a transfer mechanism disposed in the vacuum transfer space and configured to transfer a substrate between the vacuum transfer space and the substrate processing space through the first gate valve and also configured to transfer at least one annular member between the vacuum transfer space and the storage space via the second gate valve.

BRIEF DESCRIPTION OF THE DRAWINGS

The objects and features of the present disclosure will become apparent from the following description of embodiments, given in conjunction with the accompanying drawings, in which:

FIG. 9 schematically shows a state in which a substrate processing module and a ring stocker are attached.

DETAILED DESCRIPTION

Figure 1:
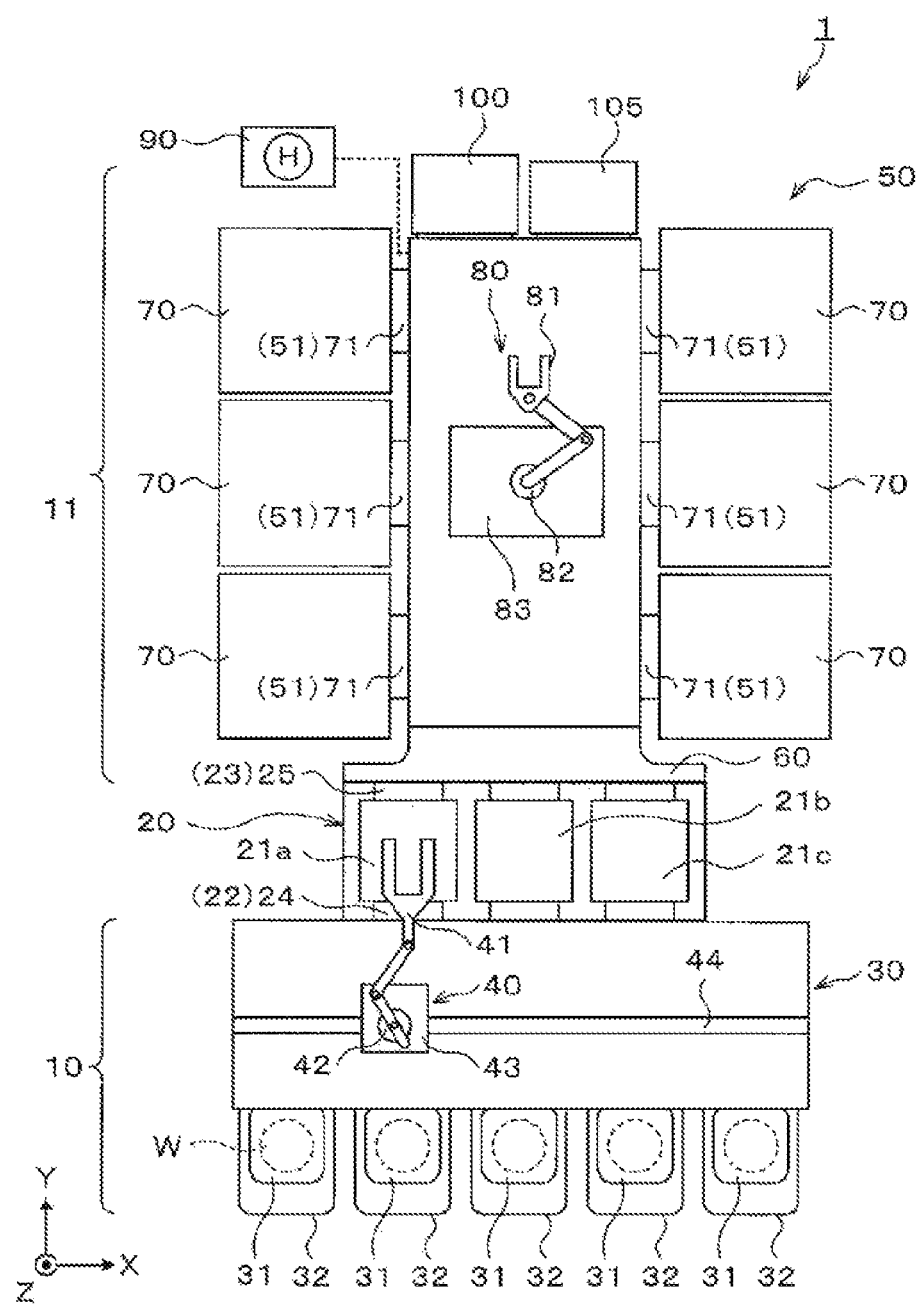
FIG. 1 is a plan view showing a schematic configuration of a wafer processing apparatus according to an embodiment.

In a semiconductor device manufacturing process, various steps for performing predetermined processing on a semiconductor wafer (hereinafter, simply referred to as "wafer") in a state where a processing module containing the wafer is set to a depressurized state. These steps are executed in a substrate processing apparatus (hereinafter, also referred to as "wafer processing apparatus") including a plurality of processing modules.

The wafer processing apparatus includes, e.g., an atmospheric part including an atmospheric module for performing predetermined processing on a wafer in an atmospheric pressure, and a depressurization part including a depressurization module for performing predetermined processing on a wafer in a depressurized atmosphere. The atmospheric part and the depressurization part are integrally connected through a load-lock module whose inner atmosphere can be switched between an atmospheric pressure and a depressurized atmosphere.

In designing a wafer processing apparatus, it is known that a plurality of processing modules or a component storage module (so-called stocker) is attached to a vacuum transfer module constituting one transfer system in a depressurization part as disclosed in U.S. Patent Publication No. 2020/0083071 A1. The modules to be attached may include, in addition to a general main process module, modules of various dimensions or configurations such as a post-processing module for post-processing on a substrate and a ring stocker for storing an edge ring such as a focus ring FR or a cover ring CR.

Further, in the vacuum transfer module constituting one transfer system, it may be considered to attach/detach modules and change types or configurations of modules to be attached depending on the content of the processing.

As multiple types of modules have different specifications or dimensions depending on the functions thereof, when they are attached to one transfer system, internal dimensions of the modules or required transfer distances may be different in the case of using a transfer mechanism of one transfer system. For example, a transfer target in the post-processing module is a substrate (wafer), whereas a transfer target in the ring stocker is an edge ring having a diameter greater than that of the substrate. Thus, both modules have different internal space dimensions. Accordingly, the transfer distances of the transfer target objects are different in different modules having different dimensions. Hence, in the case of attaching multiple modules to one transfer system, it is required to accurately transfer the transfer target objects into the respective modules.

In view of the above, the technique of the present disclosure provides a substrate processing apparatus in which various types of processing modules or a stocker can be attached without changing a design of a vacuum transfer module constituting one transfer system and a transfer target object can be accurately transferred by the transfer system. Hereinafter, a wafer processing apparatus as a substrate processing apparatus according to the embodiment will be described in detail with reference to the accompanying drawings. Like reference numerals will be given to like parts having substantially the same functions throughout this specification and the drawings, and redundant description thereof will be omitted.

<Configuration of Wafer Processing Apparatus>

First, the wafer processing apparatus according to the embodiment will be described. FIG. 1 is a plan view showing a schematic configuration of a wafer processing apparatus 1 according to the embodiment. In the present embodiment, a case where the wafer processing apparatus 1 includes a plasma processing module for performing plasma processing such as etching, film formation, diffusion, or the like on a wafer W as a substrate will be described. Further, a case of providing a post-processing module for performing, e.g., ashing as post-processing on a substrate that has been processed in the plasma processing module, or a ring stocker for storing an annular (ring) member (edge ring) disposed to surround the periphery of the wafer W will be described. However, the module configuration of the wafer processing apparatus 1 of the present disclosure is not limited thereto, and may be arbitrarily selected depending on purposes of wafer processing. Further, various units or modules having different device configurations may be provided instead of the post-processing module or the ring stocker.

As shown in FIG. 1, the wafer processing apparatus 1 has a configuration in which an atmospheric part 10 and a depressurization part 11 are integrally connected through a load-lock module 20. The atmospheric part 10 includes an atmospheric module for performing desired processing on the wafer W in an atmospheric pressure. The depressurization part 11 includes a decompression module for performing desired processing on the wafer W in a depressurized atmosphere.

The load-lock module 20 includes a plurality of (e.g., three in the present embodiment) wafer transfer chambers 21a, 21b, and 21c arranged along a width direction (X-axis direction) of a loader module 30 to be described later and a tubular fitting module 60 to be described later.

The wafer transfer chambers 21a, 21b, and 21c (hereinafter, they may be simply referred to as "wafer transfer chambers 21") as substrate transfer chambers allow the inner space of the loader module 30 to be described later in the atmospheric part 10 and the inner space of the transfer module 50 to be described later in the depressurization part 11 to communicate with each other through wafer transfer ports 22 and 23. The wafer transfer ports 22 and 23 can be opened and closed by gate valves 24 and 25, respectively.

The wafer transfer chambers 21 are configured to temporarily hold the wafer W. Further, the inner atmospheres of the wafer transfer chambers 21 can be switched between an atmospheric pressure and a depressurized atmosphere (vacuum state). In other words, the load-lock module 20 is configured to appropriately transfer the wafer W between the atmospheric part 10 in the atmospheric pressure and the depressurized part 11 in the depressurized atmosphere.

The atmospheric part 10 includes the loader module 30 having a wafer transfer mechanism 40 to be described later, and a load port 32 on which a FOUP 31 capable of storing a plurality of wafers W is placed. An orientation module (not shown) for adjusting a horizontal direction of the wafer W, a storage module (not shown) for storing a plurality of wafers W, and the like may be disposed adjacent to the loader module 30.

The loader module 30 has a rectangular housing maintained in an atmospheric pressure. A plurality of, e.g., five load ports 32 are arranged side by side on one longitudinal side of the loader module 30, in a negative direction of the Y-axis from the loader module 30. The wafer transfer chambers 21a, 21b, and 21c of the load-lock module 20 are arranged side by side on the other longitudinal side of the loader module 30, in a positive direction of the Y-axis from the loader module 30.

The wafer transfer mechanism 40 for transferring the wafer W is disposed in the loader module 30. The wafer transfer mechanism 40 includes a transfer arm 41 for holding and moving the wafer W, a rotatable table 42 for rotatably supporting the transfer arm 41, and a rotatable table base 43 on which the rotatable table 42 is placed. Further, a guide rail 44 extending in a longitudinal direction (X-axis direction) of the loader module 30 is disposed in the loader module 30. The rotatable table base 43 is disposed on the guide rail 44, and the wafer transfer mechanism 40 is configured to be movable along the guide rail 44.

The depressurization part 11 includes the transfer module 50 for transferring the wafer W therein, the tubular fitting module 60 that connects the load-lock module 20 and the transfer module 50, and processing modules (hereinafter, also referred to as "plasma processing modules") 70 for performing desired processing on the wafer W transferred from the transfer module 50. The inner atmospheres of the transfer module 50, the tubular fitting module 60, and the plasma processing modules 70 can be maintained in a depressurized atmosphere. In the present embodiment, a plurality of, e.g., six plasma processing modules 70 are connected to one transfer module 50. The number and the arrangement of the plasma processing modules 70 are not limited to those described in the present embodiment, and may be set in any appropriate manners.

In the depressurization part 11, a post-processing module 100 for performing post-processing (substrate processing) on the wafer W, which is processed in the plasma processing module 70 and transferred from the transfer module 50, and a ring stocker 105 for storing an edge ring are attached to the wall surface of the terminal end (end on the positive side of the Y-axis) of the transfer module 50. The post-processing module 100 and the ring stocker 105 are detachable, and the arrangement thereof is not limited to that described in the present embodiment and may be set in any appropriate manners.

The transfer module 50 as a vacuum transfer module is connected to the load-lock module 20 through the above-described fitting module 60. The transfer module 50 transfers the wafer W from the load-lock chamber 21a of the load-lock module 20 to one plasma processing module 70. The wafer W is subjected to desired processing, and then subjected to post-processing in the post-processing module 100, if necessary. Then, the wafer W is transferred to the atmospheric part 10 through the wafer transfer chamber 21c of the load-lock module 20. In one embodiment, the transfer module 50 has a vacuum transfer space and an opening. The opening communicates with the vacuum transfer space.

A wafer transfer mechanism 80 as a transfer mechanism for transferring the wafer W is disposed in the transfer module 50. In other words, the wafer transfer mechanism 80 is disposed in the vacuum transfer space. The wafer transfer mechanism 80 includes a transfer arm 81 for holding and moving the wafer W, a rotatable table 82 for rotatably supporting the transfer arm 81, and a rotatable table base 83 on which the rotatable table 82 is placed. The rotatable table base 83 is fixed to a central portion of the transfer module 50. In one embodiment, the wafer transfer mechanism 80 is configured to transfer the substrate between the vacuum transfer space of the transfer module 50 and the substrate processing space of the post-processing module 100 to be described later through a first gate valve 55a. Further, the wafer transfer mechanism 80 is configured to transfer at least one annular member (edge ring) between the vacuum transfer space of the transfer module 50 and the storage space of the ring stocker 105 through a second gate valve 56a. In one embodiment, the wafer transfer mechanism 80 is configured to transfer a plurality of annular members (edge rings) together between the vacuum transfer space and the storage space through the second gate valve 56a. The plurality of annular members may include a first edge ring and a second edge ring to be described later.

The fitting module 60 connects the load-lock module 20 and the transfer module 50 as described above.

The plasma processing modules 70 perform plasma processing such as etching, film formation, diffusion, or the like on the wafer W. Any module for performing processing can be selected as the processing modules 70 depending on purposes of wafer processing. Further, the plasma processing modules 70 communicate with the transfer module 50 through wafer transfer ports 51 formed on sidewalls of the transfer module 50, and the wafer transfer ports 51 can be opened and closed by gate valves 71.

The post-processing module 100 performs post-processing such as ashing or the like on the wafer W processed in the plasma processing module 70. In one embodiment, the post-processing module 100 is an ashing module. The post-processing module 100 is used, if necessary. When the post-processing module 100 is unnecessary, the wafer W processed in the plasma processing module 70 is transferred to the atmosphere part 10. In one embodiment, the post-processing module (substrate processing module) 100 is attached to a wall unit 110 to be described later and has a processing space (substrate processing space). The processing space communicates with the vacuum transfer space of the transfer module 50 through the first gate valve 55a to be described later.

The ring stocker 105 stores a general edge ring used for improving the uniformity of processing during plasma processing performed on the wafer W in a semiconductor manufacturing apparatus. The edge ring is taken out from the ring stocker 105 and appropriately used when it is required such as when the plasma processing is performed in the plasma processing module 70. In one embodiment, the ring stocker 105 is attached to the wall unit 110 to be described later, and has a storage space for storing at least one edge ring (annular member) used in the plasma processing module 70. At least one edge ring is disposed to surround the substrate in the plasma processing module 70. Alternatively, a plurality of edge rings may be used together in the plasma processing module 70. In one embodiment, the plurality of edge rings includes a first edge ring and a second edge ring, and an outer diameter of the second edge ring is greater than an outer diameter of the first edge ring. In one embodiment, the first edge ring is made of an Si material or an SiC material and the second edge ring is made of quartz. The first edge ring and the second edge ring may be made of the same material. For example, the first edge ring and the second edge ring may be made of quartz. The storage space communicates with the vacuum transfer space of the transfer module 50 through the second gate valve 56a to be described later.

As shown in FIG. 1, the wafer processing apparatus 1 configured as described above includes a controller 90. The controller 90 is, e.g., a computer having a CPU, a memory, or the like, and includes a program storage (not shown). The program storage stores a program for controlling the transfer or the processing of the wafer W in the wafer processing apparatus 1. The program may be recorded in a computer-readable storage medium H and may be retrieved from the storage medium H and installed on the controller 90.

<Configuration of Modules>

Figure 2:
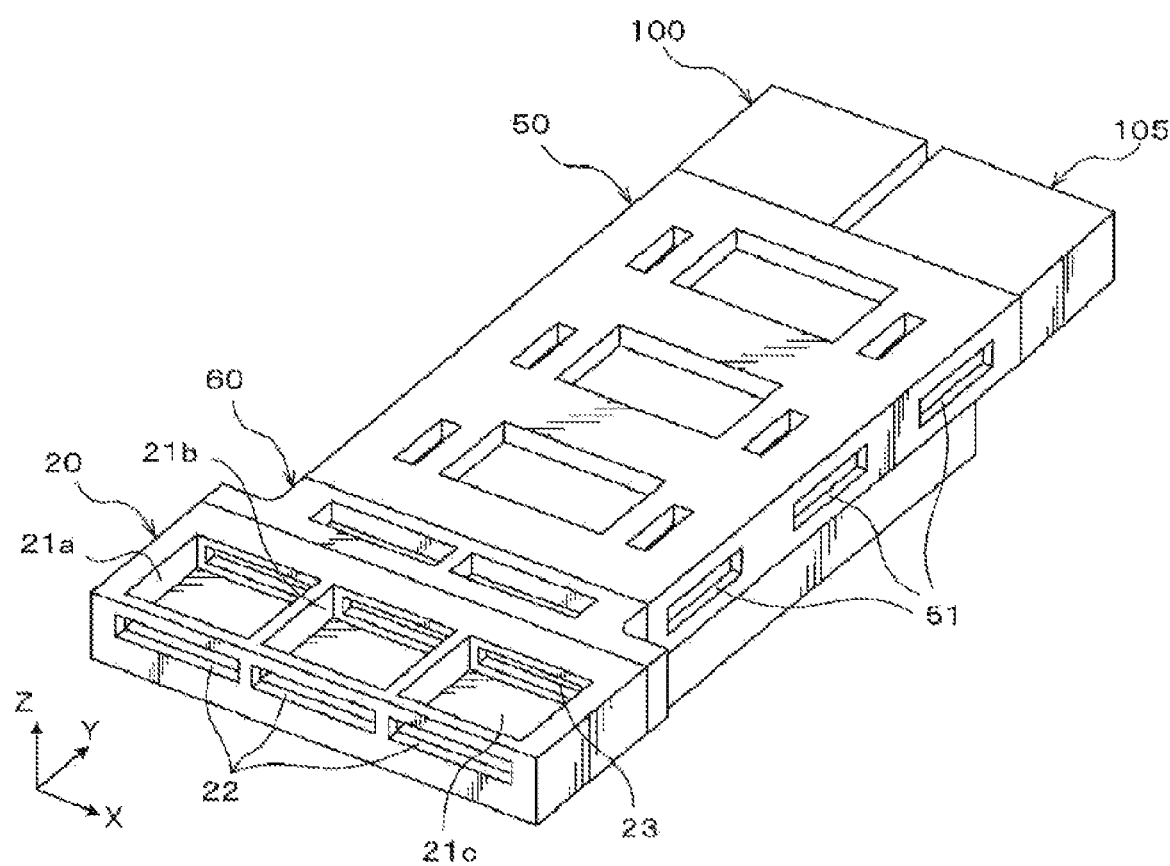
FIG. 2 is a perspective view schematically showing a schematic configuration of a module according to an embodiment.
Figure 3:
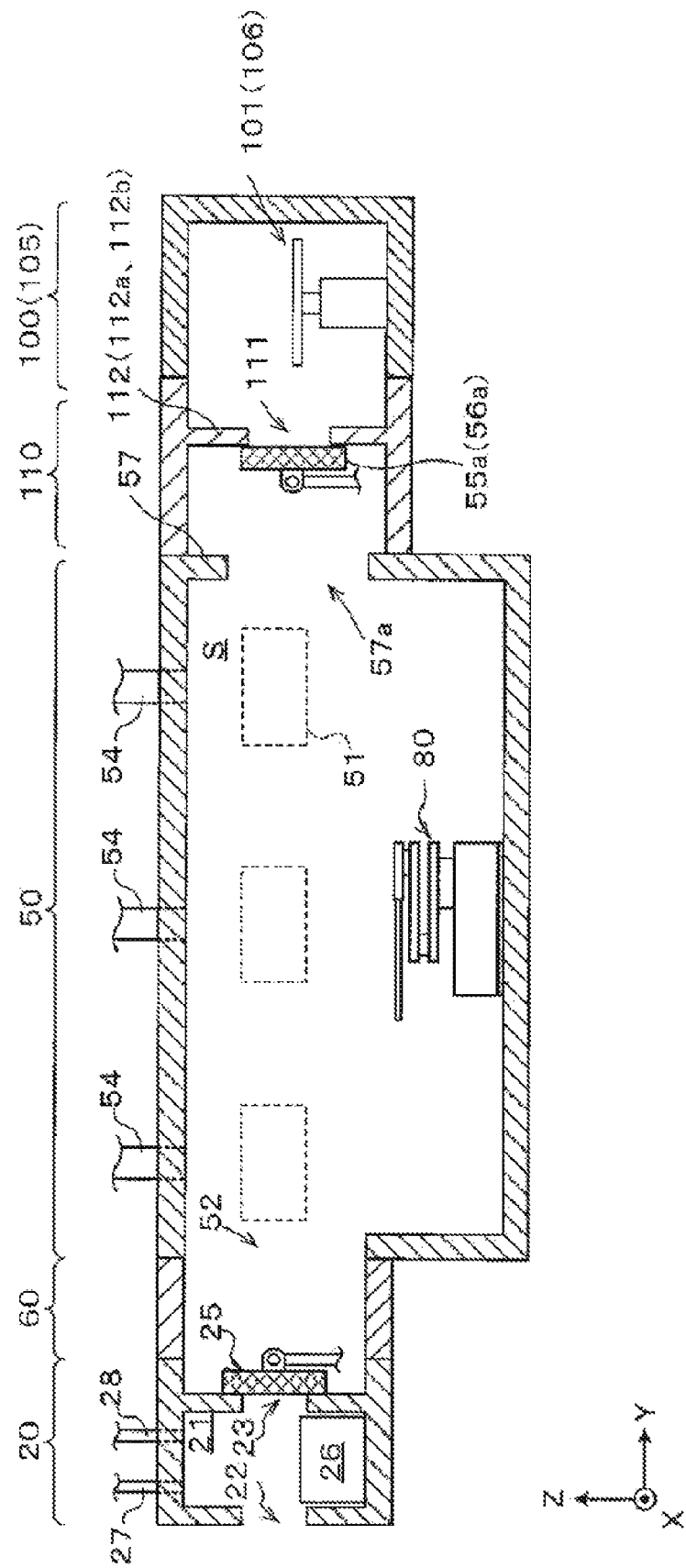
FIG. 3 is a vertical cross-sectional view showing the schematic configuration of the module according to the embodiment.

The wafer processing apparatus 1 according to the embodiment is configured as described above. Next, a detailed configuration of modules will be described. FIGS. 2 and 3 are respectively a perspective view and a vertical cross-sectional view showing schematic configurations of the load-lock module 20, the transfer module 50, the fitting module 60, the post-processing module 100, and the ring stocker 105.

As shown in FIGS. 2 and 3, the load-lock module 20, the fitting module 60, the transfer module 50, and the post-processing module 100 (or the ring stocker 105) are connected side by side in that order from the negative side of the Y-axis.

As shown in FIG. 2, the load-lock module 20 has the three wafer transfer chambers 21a, 21b, and 21c arranged side by side along the width direction (X-axis direction) of the tubular fitting module 60. A wafer transfer port 22 for transferring a wafer W to and from the loader module 30 and a wafer transfer port 23 as a substrate transfer port for transferring a wafer W to and from the transfer module 50 are formed in each of the three wafer transfer chambers 21. In other words, three wafer transfer ports 22 and three wafer transfer ports 23 are formed on the sidewall of the load-lock module 20 on the negative side of the Y-axis and the sidewall of the load-lock module on the positive side of the Y-axis, respectively.

As described above, the wafer transfer chambers 21 of the load-lock module 20 are connected to the loader module 30 and the transfer module 50 through the gate valves 24 and the gate valves 25, respectively. The gate valves 24 and 25 ensure airtightness between the wafer transfer chambers 21 and the loader module 30 and between the wafer transfer chambers 21 and the transfer module 50 and communication therebetween.

As shown in FIG. 3, the wafer transfer chamber 21 is provided with a stocker 26 for temporarily holding the wafer W transferred between the loader module 30 and the transfer module 50.

Further, as shown in FIG. 3, an air supply port 27 for supplying a gas into the wafer transfer chamber 21 and a venting port 28 for venting a gas are connected to the load-lock module 20. The load-lock module 20 is configured such that the inner atmospheres of the wafer transfer chambers 21 can be switched between an atmospheric pressure and a depressurized atmosphere by using the air supply port 27 and the venting port 28.

An opening 52 through which the wafer W is transferred to and from the fitting module 60 is formed at one end of the transfer module 50 on the negative side of the Y-axis to which the fitting module 60 is connected. Further, a wafer transfer port 57a is formed on a terminal wall surface 57 as the other end of the transfer module 50 on the positive side of the Y-axis. An end part (wall unit) 110 for transferring the wafer W between the post-processing module 100 and the ring stocker 105 is attached to the terminal wall surface 57. A placement table 101 or 106 for placing the wafer W or the edge ring thereon is disposed in each of the post-processing module 100 and the ring stocker 105.

The end part 110 includes a main body 112 where wafer transfer port 111 (111a and 111b) is formed, and the first gate valve 55a and the second gate valve 56a to be described later. In one embodiment, the wall unit 110 is attached to the opening of the transfer module 50. In other words, the wall unit 110 defines a part of the vacuum transfer space. In one embodiment, the wall unit 110 has a first space and a second space. The first space of the wall unit 110 is disposed between the vacuum transfer space of the transfer module 50 and the substrate processing space of the post-processing module 100. The second space of the wall unit 110 is disposed between the vacuum transfer space of the transfer module 50 and the storage space of the ring stocker 105. The first gate valve 55a is disposed in the first space, and the second gate valve 56a is disposed in the second space. In one embodiment, the first gate valve 55a is disposed on the surface of the wall unit 110 close to the post-processing module 100, and the second gate valve 56a is disposed on the surface of the wall unit 110 close to the ring stocker 105. In one embodiment, the inner length of the second space is greater than the inner length of the first space. In this case, the second gate valve 56a is distant from the transfer module 50 compared to the first gate valve 55a. Detailed configurations of the post-processing module 100 and the ring stocker 105 will be described later with reference to FIG. 4.

As illustrated, no plate or gate valve is disposed between the transfer module 50 and the tubular fitting module 60. In other words, the inner space of the transfer module and the inner space of the tubular fitting module 60 communicate with each other, thereby defining an integrated transfer space S where the wafer W is transferred by the wafer transfer mechanism 80.

As described above, a plurality of (six to correspond to the number of plasma processing modules 70 in the present embodiment) wafer transfer ports 51 communicating with the plasma processing modules 70 are formed on the longitudinal sides of the transfer module 50 on the negative side and the positive side of the X-axis. The wafer transfer ports 51 can be opened and closed by the gate valves 71 (see FIG. 1).

Further, a gas supply 54 for supplying an inert gas (e.g., $N_2$ gas) to the transfer space S is connected to a ceiling surface of the transfer module 50 that is located above the wafer transfer ports 51. The gas supply 54 supplies an inert gas to the transfer space S to shut off the wafer transfer ports 51, i.e., to form an air curtain. Therefore, scattering of particles or the like from the plasma processing modules 70 into the transfer module 50 at the time of opening the gate valves 71 is suppressed.

Further, the gas supply 54 supplies an inert gas into the transfer space S to eliminate stagnation of air flow in the transfer space S and appropriately exhaust the transfer space S using an exhaust mechanism 64 (to be described later) connected to the tubular fitting module 60.

<Configurations of Post-Processing Module and Ring Stocker>

Figure 4:
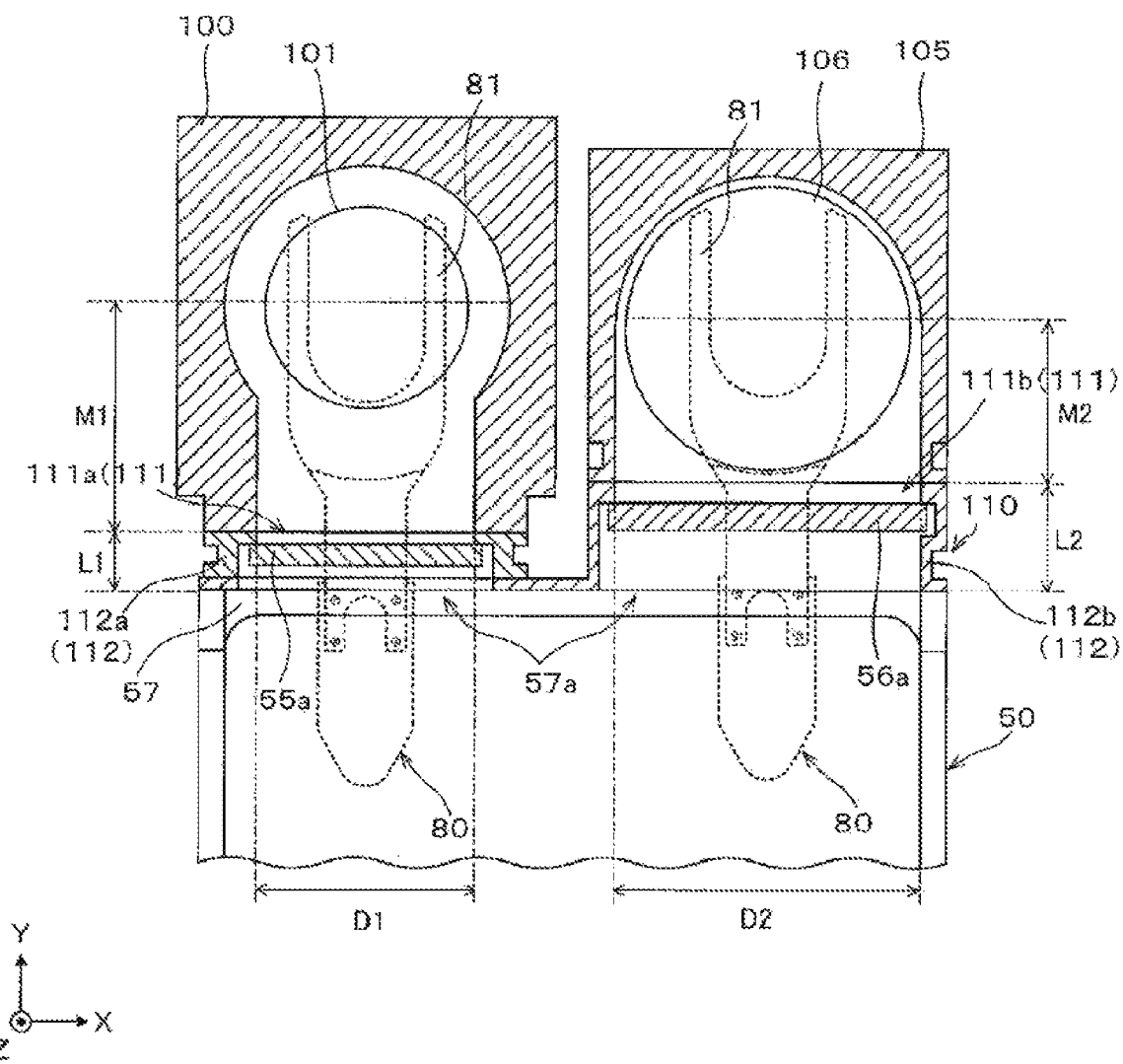
FIG. 4 is a schematic horizontal cross-sectional view showing configurations of an end part, a post-processing module, and a ring stocker.

Next, the detailed configurations of the post-processing module 100 and the ring stocker 105 will be described. FIG. 4 is a schematic horizontal cross-sectional view showing the configurations of the end part (wall unit) 110, the post-processing module 100, and the ring stocker 105 disposed at the terminal wall surface 57 of the transfer module 50 in the wafer processing apparatus 1, and shows an enlarged view of the vicinity of the post-processing module 100 and the ring stocker 105. In FIG. 4, a state in which the wafer transfer mechanism 80 (transfer arm 81) is extended into each module is indicated by dashed lines.

As shown in FIG. 4, the end part 110 including the first gate valve 55a and the second gate valve 56a is attached to the terminal wall surface 57 of the transfer module 50. The end part 110 includes the main body 112 having the wafer transfer port 111 (111a and 111b) that can be opened and closed by the first gate valve 55a and the second gate valve 56a. The end part 110 is configured such that the main body 112 can be attached to the terminal wall surface 57 of the transfer module 50. The attachment method is not particularly limited, but the main body 112 may be attached to the terminal wall surface 57 using screws, for example. The post-processing module 100 is attached to the end wall surface 57 through the first gate valve 55a of the end part 110, and the ring stocker 105 is attached thereto through the second gate valve 56a of the end part 110.

The main body 112 of the end part 110 is formed by connecting a first main body 112a and a second main body 112b. The first main body 112a is a hollow housing that connects the terminal wall surface 57 and the post-processing module 100. The side surface of the first main body 112 facing the terminal wall surface 57 is opened, and the wafer transfer port 111a is formed on the side surface of the first main body 112 facing the post-processing module 100. The first gate valve 55a is disposed in the first main body 112a. The second main body 112b is a hollow housing that connects the terminal wall surface 57 and the ring stocker 105. The side surface of the second main body 112b facing the terminal wall surface 57 is opened, and the wafer transfer port 111b is formed on the side surface of the second main body 112b facing the ring stocker 105. The second gate valve 55b is disposed in the first main body 112a. The configuration of the main body 112 is arbitrary. For example, in the configuration of the present embodiment, the first gate valve 55a and the second gate valve 56a have different configurations, so that the thickness (thickness in the Y-axis direction) in the width direction (X-axis direction) varies depending on portions.

The configuration of the end part 110 is not limited to the illustrated one. For example, the first gate valve 55a and the second gate valve 56a may have different dimensions or structures. In other words, the first gate valve 55a may be a so-called bonnet type gate valve, and the second gate valve 56a may be a so-called insert type gate valve. The bonnet type first gate valve is attached to a convex portion of the first main body 112a. The insert type gate valve is attached to a concave portion of the second main body 112b.

In the configuration of the present embodiment, as shown in FIG. 4, the end part 110 has a configuration in which a thickness L1 in the Y-axis direction of the portion corresponding to the first gate valve 55a and a thickness L2 in the Y-axis direction of the portion corresponding to the second gate valve 56a are different and have a relationship of L1<L2. In other words, the distance L1 between the post-processing module 100 and the terminal wall surface 57 of the transfer module 50 is smaller than the distance L2 between the ring stocker 105 and the terminal wall surface 57 of the transfer module 50.

Various modules such as the post-processing module 100 and the ring stocker 105 have different chamber thicknesses, internal space dimensions, and the like depending on characteristics thereof, so that the distances from the module entrances to the transfer center are different depending on the modules. In the configuration of the present embodiment, as shown in FIG. 4, a distance M1 from the module entrance to the transfer center in the post-processing module 100 and a distance M2 from the module entrance to the transfer center in the ring stocker 105 have a relationship of M1>M2. This is because the post-processing module 100 that may perform plasma processing has a thick module wall and the size of the entire housing of the module is larger than that of the ring stocker 105.

Further, as shown in FIG. 4, a width (dimension in the X-axis direction) D1 of the first gate valve 55*a* and a width (dimension in the X-axis direction) D2 of the second gate valve 56*a* have a relationship of D1<D2. This is because the transfer target of the post-processing module 100 is the wafer W, whereas the transfer target of the ring stocker 105 is an edge ring having a diameter greater than that of the wafer W.

In designing the wafer processing apparatus 1 in the semiconductor device manufacturing process, the design or dimensions of various modules such as the post-processing module 100 and the ring stocker 105 are predetermined depending on the processing content and the like. In other words, the distance M1 from the module entrance to the transfer center in the post-processing module 100 and the distance M2 from the module entrance to the transfer center in the ring stocker 105 are predetermined.

On the other hand, the end part 110 of the present embodiment is detachably attached to the terminal wall surface 57 of the transfer module 50. In other words, the design thereof is arbitrary, and multiple types of end parts 110 can be manufactured and prepared. It is also possible to arbitrarily design the widths D1 and D2 of the first gate valve 55*a* and the second gate valve 56*a* accommodated in the end part 110. For example, as in the configuration of the present embodiment, it is possible to use the end part 110 designed to accommodate the first gate valve 55*a* having the width D1 suitable for the design of the post-processing module 100 and the second gate valve 56*a* having the width D2 suitable for the design of the ring stocker 105.

In the wafer processing apparatus 1 of the present embodiment, as described above, the end part 110 is detachably attached to the terminal wall surface 57 of the transfer module 50, and various modules such as the post-processing module 100 and ring stocker 105 are attached through the end part 110. Accordingly, it is possible to attach various modules such as the post-processing module 100 and the ring stocker 105 through the end part 110 without changing the design of the transfer module 50 as the vacuum transfer module.

By properly designing the end part 110, the transfer target object (the wafer W, the edge ring, or the like) can be accurately transferred to the post-processing module 100 and the ring stocker 105. Specifically, the transfer distance in each module can be desirably adjusted by manufacturing the end part 110 in which the thickness L1 in the Y-axis direction of the first gate valve 55*a* and the thickness L2 in the Y-axis direction of the second gate valve 56*a* are set to desired values. Specifically, the transfer distance in the post-processing module 100 according to the present embodiment is L1+M1, and the transfer distance in the ring stocker 105 is L2+M2. By changing the values of L1 and L2 depending on the design of the end part 110, the transfer distance in each module can be designed to a desired distance.

The embodiments of the present disclosure are illustrative in all respects and are not restrictive. The above-described embodiments may be omitted, replaced, or changed in various forms without departing from the scope of the appended claims and the gist thereof.

In the above-described embodiment, the case where the end part 110 includes the first gate valve 55*a* that is a so-called bonnet type gate valve, and the second gate valve 56*a* that is a so-called insert type gate valve has been illustrated and described, but the present disclosure is not limited to thereto. For example, when two post-processing modules are attached to the terminal wall surface 57 of the transfer module 50, an end part accommodating two so-called bonnet type gate valves may be manufactured. Further, for example, when two ring stockers are attached to the terminal wall surface 57 of the transfer module 50, an end part accommodating two so-called insert type gate valves may be manufactured. As described above, since the end part is detachably attached to the transfer module 50, the end parts may be distinguished depending on types of module to be attached. Therefore, the wafer processing apparatus 1 includes a flexible system attached to the opening of the transfer module 50. The flexible system selectively includes any one of a first replaceable unit, a second replaceable unit and a third replaceable unit. The first replaceable unit includes a first wall unit (not shown) and two post-processing modules 100. The first wall unit is attached to the opening of the transfer module 50 and includes two first gate valves 55*a*. The two post-processing modules 100 are attached to the first wall unit. Each of the post-processing modules 100 has a substrate processing space communicating with the vacuum transfer space of the transfer module 50 through the first gate valve 55*a*. The second replaceable unit includes a second wall unit (not shown) and two ring stockers 105. The second wall unit is attached to the opening of the transfer module 50 and includes two second gate valves 56*a*. The two ring stockers 105 and 105 are attached to the second wall unit. Each of the ring stockers 105 has a storage space for storing one or more edge rings (annular members) used in the plasma processing module 70. The storage space communicates with the vacuum transfer space of the transfer module 50 through the second gate valve 56*a*. The third replaceable unit includes a third wall unit 110, one post-processing module 100, and one ring stocker 105.

End parts of various designs and configurations may be considered. For example, when the module is not attached to the end wall 57 of the transfer module 50, a so-called end plate that covers and blocks the end wall 57 with a plate-shaped member may be attached. In other words, a unit flexible system may selectively include any one of a first replaceable unit, a second replaceable unit, a third replaceable unit, and a fourth replaceable unit. The fourth replaceable unit includes a fourth wall unit (end plate). In addition, the wafer processing apparatus 1 may have a configuration in which an additional vacuum transfer module is connected to one vacuum transfer module. In that case, instead of the end part according to the above-described embodiment, a tubular path module that connects the vacuum transfer modules and transfers the substrate between the vacuum transfer modules may be attached.

Figure 5:
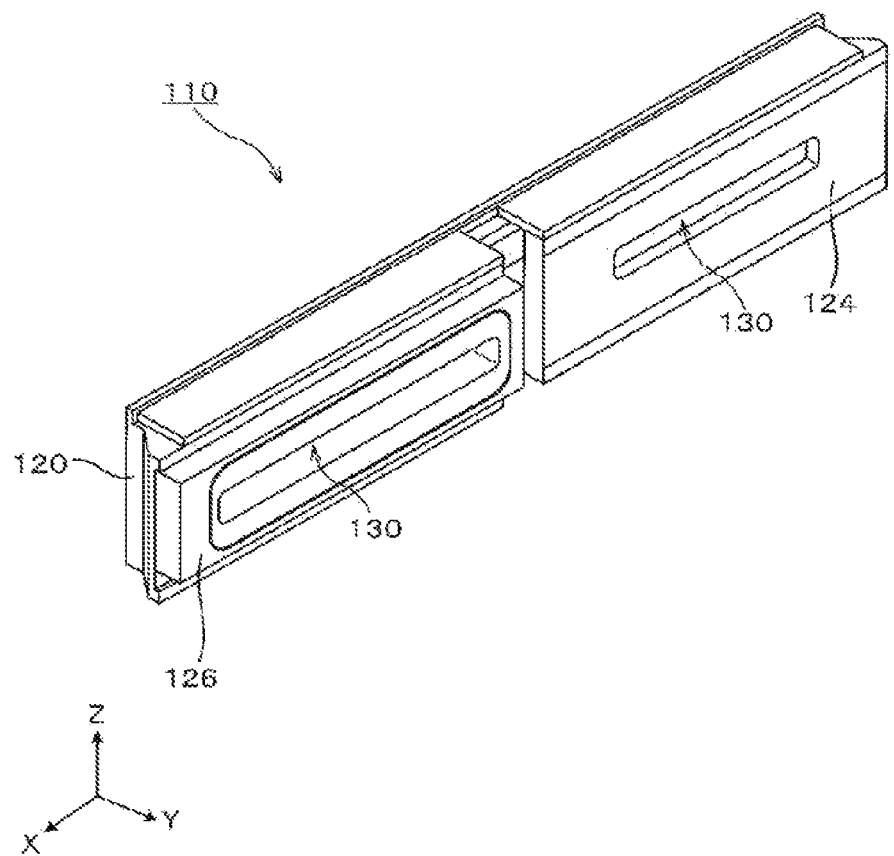
FIG. 5 is a schematic perspective view showing a configuration of an end part according to another embodiment.
Figure 6:
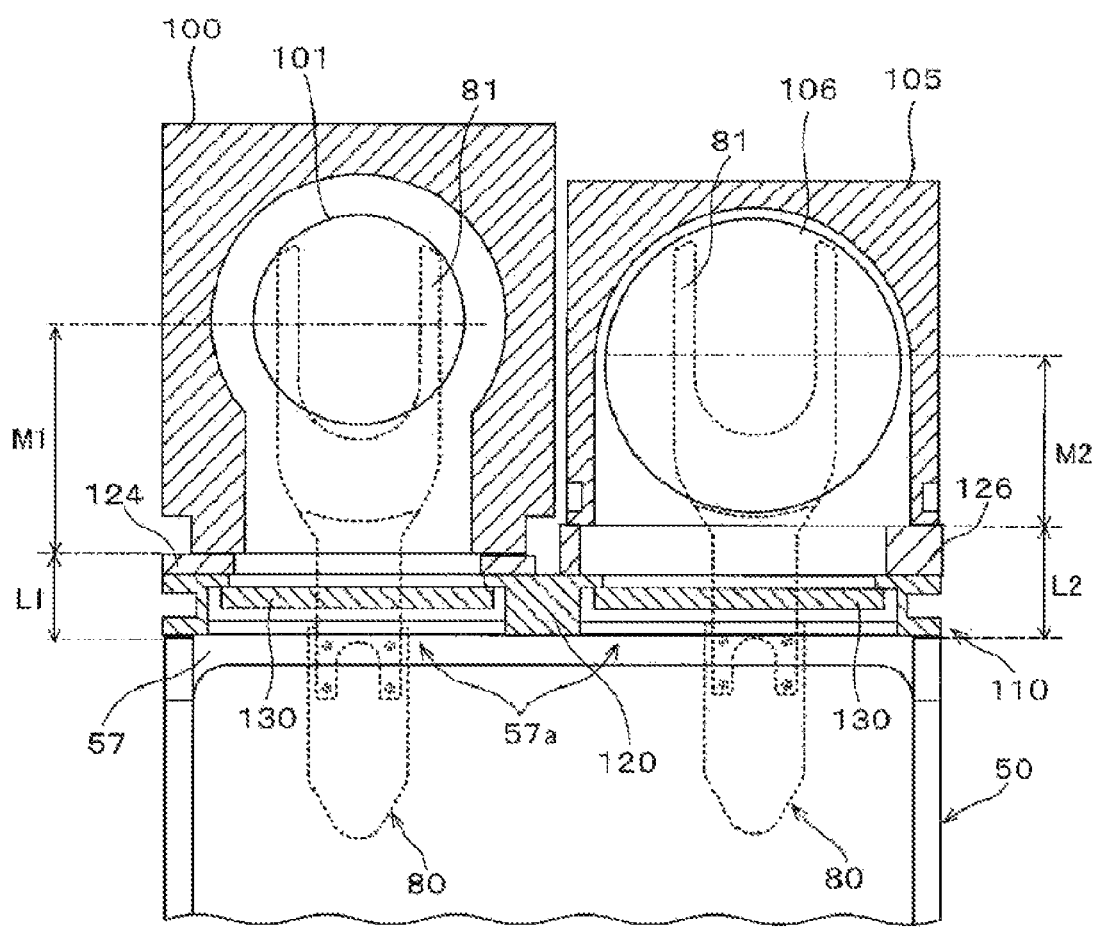
FIG. 6 is a schematic plan view showing the configuration of the end part according to another embodiment.

Further, instead of the configuration of the end part 110 according to the above-described embodiment, the end part 110 may include a common end plate and opening plates corresponding to the replaceable units (e.g., the post-processing module 100 and the ring stocker 105). FIGS. 5 and 6 schematically explain a configuration of an end part 110 according to another embodiment. FIG. 5 is a schematic perspective view, and FIG. 6 is a schematic plan view. In describing the present embodiment, like reference numerals will be given to like parts having the same functions as those of the above-described embodiment, and redundant description thereof may be omitted.

As shown in FIGS. 5 and 6, the end part 110 includes a common end plate 120 accommodating two gate valves, and an opening plate for the substrate processing module for the substrate processing module 124 and an opening plate for the ring stocker 126 that are detachably disposed to correspond to gate valves 130. In the present embodiment, the configuration of the two gate valves 130 disposed at the end part 110 is arbitrary, and the gate valves 130 may be any one of the above-described so-called bonnet type gate valve and insert type gate valve, for example.

In other words, in a state where the common end plate 120 is attached to the terminal wall surface 57 of the transfer module 50, the opening plate for the substrate processing module 124 and the opening plate for the ring stocker 126 may be detachably provided in any configuration. Any attachment/detachment device may be used, and they may be fixed by screws, for example. For example, as shown in FIG. 6, the opening plate for the substrate processing module 124 and the post-processing module 100 may be attached to one of the gate valves 130 in that order from the apparatus main body side. Further, the opening plate for the ring stocker 126 and the ring stocker 105 may be attached to the other gate valve 130 in that order from the apparatus main body side.

Figure 7:
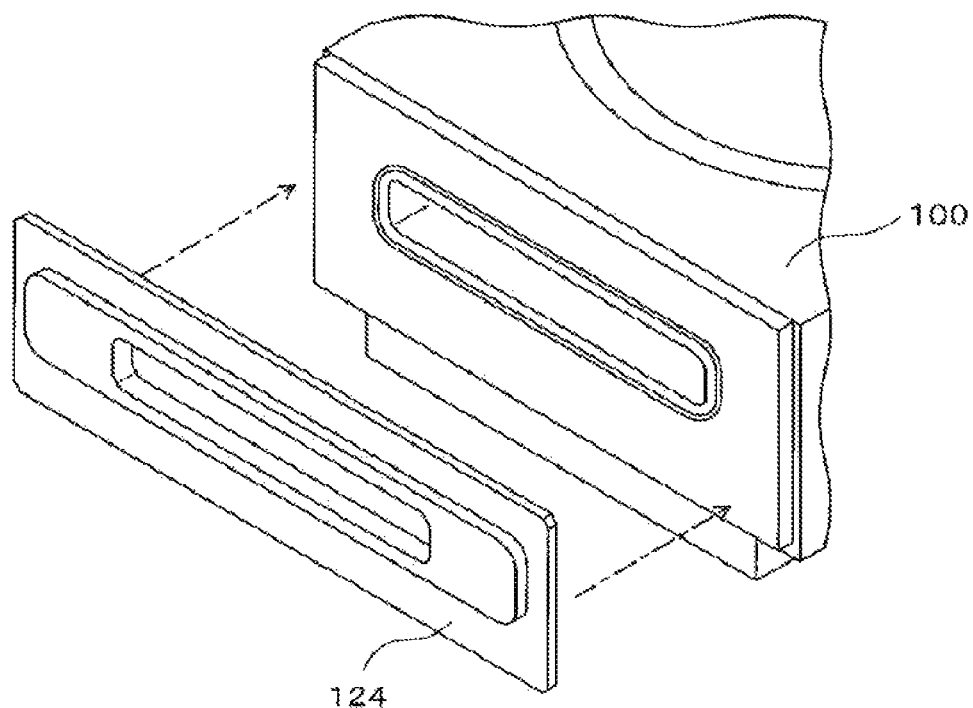
FIG. 7 is a detailed view of an opening plate for the substrate processing module.
Figure 8:
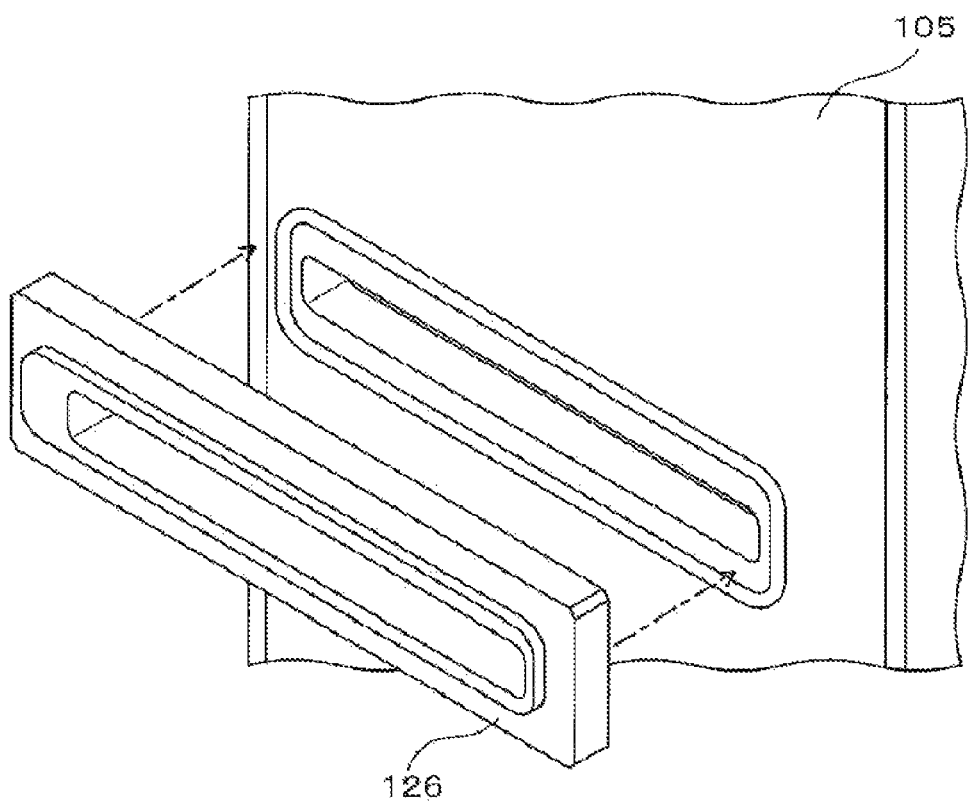
FIG. 8 is a detailed view of an opening plate for the ring stocker.

FIG. 7 is a detailed view of the opening plate for the substrate processing module 124. FIG. 8 is a detailed view of the opening plate for the ring stocker 126. FIG. 7 shows a state in which the opening plate for the substrate processing module 124 is attached to the post-processing module 100. FIG. 8 shows a state in which the opening plate for the ring stocker 126 is attached to the ring stocker 105. As can be seen from the comparison of FIGS. 7 and 8, the thickness of the opening plate for the substrate processing module 124 and the thickness of the opening plate for the ring stocker 126 are considerably different. The opening plate for the ring stocker 126 is thicker than the opening plate for the substrate processing module 124. Accordingly, as described in the above-described embodiment, the end part 110 may have the configuration in which the thickness L1 in the Y-axis direction at one gate valve 130 and the thickness L2 in the Y-axis direction at the other gate valve 130 may be different (L1<L2) (see FIG. 6).

In the present embodiment, the opening plate for the substrate processing module 124 and the opening plate for the ring stocker 126 are attached and detached, if necessary. Accordingly, the transfer distance L1+M1 in the post-processing module 100 and the transfer distance L2+M2 in the ring stocker 105 can be easily adjusted using the opening plate corresponding to a desired module to be attached. In particular, since both transfer distances can be easily adjusted without replacing the common end plate 120.

FIG. 9 schematically shows a state in which the post-processing module 100 and the ring stocker 105 are attached to the gate valves 130 of the end part 110 according to the present embodiment. As shown in FIG. 9, the dimensions of the modules attached to the terminal wall surface 57 of the transfer module 50 through the end part 110 may be considerably different depending on types thereof. By employing the configuration in which the end part 110 includes the common end plate 120 and the opening plates 124 and 126, various modules can be easily attached and detached even when the dimensions of the modules to be attached are considerably different as shown in FIG. 9.

In the above-described embodiment, the wafer transfer mechanism 80 basically transfers the wafer W. However, the edge ring ER may be used when plasma processing is performed on the wafer W in the plasma processing module 70 as in the wafer processing apparatus 1 according to the present embodiment. In that case, the edge ring ER can be transferred by a vacuum transfer part. For example, the ring stocker 105 according to the above-described embodiment stores a general edge ring used for performing the plasma processing in the plasma processing module 70. In such a configuration, the wafer transfer mechanism 80 is preferably configured to transfer the edge ring as well as the wafer W.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus comprising:
a vacuum transfer module having a vacuum transfer space and an opening;
a wall unit attached to the opening and including a first gate valve and a second gate valve, a width of the second gate valve being greater than a width of the first gate valve; a substrate processing module attached to the wall unit and having a substrate processing space communicating with the vacuum transfer space via the first gate valve;
a ring stocker attached to the wall unit and having a storage space for storing at least one annular member used in a plasma processing module, the storage space communicating with the vacuum transfer space via the second gate valve; and
a transfer mechanism disposed in the vacuum transfer space and configured to transfer a substrate between the vacuum transfer space and the substrate processing space through the first gate valve and also configured to transfer at least one annular member between the vacuum transfer space and the storage space via the second gate valve,
wherein the first gate valve is a bonnet type gate valve, and the second gate valve is an insert type gate valve.

2. The substrate processing apparatus of claim 1, wherein the second gate valve is distant from the vacuum transfer module compared to the first gate valve.

3. The substrate processing apparatus of claim 1, wherein the substrate processing module is a post-processing module.

4. The substrate processing apparatus of claim 3, wherein the post-processing module is an ashing module.

5. The substrate processing apparatus of claim 1, wherein the wall unit has a first space and a second space, the first space being disposed between the vacuum transfer space and the substrate processing space, the second space being disposed between the vacuum transfer space and the substrate process space, the first gate valve being disposed in the first space, the second gate valve being disposed in the second space.

6. A substrate processing apparatus comprising:
- a vacuum transfer module having a vacuum transfer space and an opening;
- a wall unit attached to the opening and including a first gate valve and a second gate valve, a width of the second gate valve being greater than a width of the first gate valve; a substrate processing module attached to the wall unit and having a substrate processing space communicating with the vacuum transfer space via the first gate valve;
- a ring stocker attached to the wall unit and having a storage space for storing at least one annular member used in a plasma processing module, the storage space communicating with the vacuum transfer space via the second gate valve; and
- a transfer mechanism disposed in the vacuum transfer space and configured to transfer a substrate between the vacuum transfer space and the substrate processing space through the first gate valve and also configured to transfer at least one annular member between the vacuum transfer space and the storage space via the second gate valve, wherein the wall unit includes:
- a common end plate attached to the opening and including the first gate valve and the second gate valve;
- an opening plate for the substrate processing module disposed between the common end plate and the substrate processing module; and
- an opening plate for the ring stocker disposed between the common end plate and the ring stocker.

* * * * *